(12) United States Patent
Murphy et al.

(10) Patent No.: US 8,072,037 B2
(45) Date of Patent: *Dec. 6, 2011

(54) METHOD AND SYSTEM FOR ELECTRICALLY COUPLING A CHIP TO CHIP PACKAGE

(75) Inventors: Tim Murphy, Boise, ID (US); Lee Gotcher, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/777,118

(22) Filed: May 10, 2010

(65) Prior Publication Data

US 2010/0219421 A1 Sep. 2, 2010

Related U.S. Application Data

(60) Continuation of application No. 11/971,150, filed on Jan. 8, 2008, now Pat. No. 7,732,882, which is a continuation of application No. 10/651,601, filed on Aug. 29, 2003, now Pat. No. 7,335,985, which is a division of application No. 09/978,983, filed on Oct. 15, 2001, now Pat. No. 6,831,301.

(51) Int. Cl.
*H01L 27/22* (2006.01)
*G11C 5/02* (2006.01)

(52) U.S. Cl. ............ 257/427; 365/51; 365/97; 365/157; 365/158; 365/189.011

(58) Field of Classification Search .................. 257/414, 257/428, 659, 660, 427; 365/51, 189.011, 365/157, 158, 97
See application file for complete search history.

(56) References Cited

U.S. PATENT DOCUMENTS

| | | | |
|---|---|---|---|
| 4,199,777 A | 4/1980 | Maruyama et al. | 257/53 |
| 4,268,843 A | 5/1981 | Brown et al. | 257/82 |
| 4,758,062 A | 7/1988 | Sunagawa et al. | 350/96.19 |
| 5,047,835 A | 9/1991 | Chang | 357/74 |
| 5,051,790 A | 9/1991 | Hammer | 357/19 |
| 5,198,684 A | 3/1993 | Sudo | 257/79 |
| 5,200,631 A | 4/1993 | Austin et al. | 257/81 |
| 5,237,441 A | 8/1993 | Nhu | 359/152 |
| 5,335,361 A | 8/1994 | Ghaem | 455/66 |
| 5,424,573 A | 6/1995 | Kato et al. | 257/431 |
| 5,638,469 A | 6/1997 | Feldman et al. | 385/14 |

(Continued)

OTHER PUBLICATIONS

Sclater, Neil, "Random-Access Memories (RAMs)," Electronics Technology Handbook, New York: McGraw-Hill, pp. 178-181, 1999.

*Primary Examiner* — Jasmine Clark
(74) *Attorney, Agent, or Firm* — Dorsey & Whitney LLP

(57) ABSTRACT

A chip and a chip package can transmit information to each other by using a set of converters capable of communicating with each other through the emission and reception of electromagnetic signals. Both the chip and the chip package have at least one such converter physically disposed on them. Each converter is able to (1) convert received electromagnetic signals into electronic signals, which it then may relay to leads on the device on which it is disposed; and (2) receive electronic signals from leads on the device on which it is disposed and convert them into corresponding electromagnetic signals, which it may transmit to a corresponding converter on the other device. Not having a direct physical connection between the chip and the chip package decreases the inductive and capacitive effects commonly experienced with physical bonds.

20 Claims, 3 Drawing Sheets

U.S. PATENT DOCUMENTS

| | | | |
|---|---|---|---|
| 6,049,639 A | 4/2000 | Paniccia et al. | 385/14 |
| 6,093,938 A | 7/2000 | Minemier et al. | 257/80 |
| 6,215,577 B1 | 4/2001 | Koehl et al. | 359/261 |
| 6,229,158 B1 | 5/2001 | Minemier et al. | 257/81 |
| 6,477,285 B1 | 11/2002 | Shanley | 385/14 |
| 6,477,286 B1 | 11/2002 | Ouchi | 385/14 |
| 6,586,726 B2 | 7/2003 | Verdiell | 250/239 |
| 6,617,181 B1 | 9/2003 | Wright et al. | 438/18 |
| 6,815,621 B2 | 11/2004 | Park et al. | 174/260 |
| 6,822,267 B1 | 11/2004 | Okayasu | 257/92 |
| 6,831,301 B2 | 12/2004 | Murphy et al. | 257/83 |
| 6,842,347 B2 | 1/2005 | Chang | 361/780 |
| 6,936,489 B2 | 8/2005 | Murphy et al. | 438/25 |
| 7,015,559 B2 | 3/2006 | Murphy et al. | 257/433 |
| 7,335,985 B2 | 2/2008 | Murphy et al. | 257/723 |
| 7,732,882 B2 * | 6/2010 | Murphy et al. | 257/427 |

* cited by examiner

METHOD AND SYSTEM FOR ELECTRICALLY COUPLING A CHIP TO CHIP PACKAGE

CROSS-REFERENCE TO RELATED APPLICATIONS

This application is a continuation of U.S. patent application Ser. No. 11/971,150, filed Jan. 8, 2008, U.S. Pat. No. 7,732,882, which is a continuation of U.S. patent application Ser. No. 10/651,601, filed Aug. 29, 2003, U.S. Pat. No. 7,335,985, which is a divisional of U.S. patent application Ser. No. 09/978,983, filed Oct. 15, 2001, U.S. Pat. No. 6,831,301. These applications are incorporated by reference herein in their entirety and for all purposes.

TECHNICAL FIELD

The present invention is related generally to semiconductor integrated circuits, and more specifically to a method and system for electrically coupling a semiconductor chip to a chip package.

BACKGROUND OF THE INVENTION

During the manufacture of integrated circuit devices, such as memories and microprocessors, a semiconductor die or chip must be physically and electrically attached to a chip package. A chip is a small piece of semiconductor material, such as silicon, in which an integrated circuit is formed, and a chip package as used herein is a protective container, such as a plastic dual-in-line package (DIP), or printed circuit board to which the chip is coupled, as will be appreciated by those skilled in the art.

To electrically couple a chip to a chip package, electrical connections are formed between regions on the chip known as bonding pads, and leads or corresponding bonding pads on the chip package. This process can entail the creation of hundreds of electrical connections between the chip and chip package. Three techniques are generally relied on to accomplish this task: (1) wire bonding; (2) flip chip/bump bonding; and (3) tape automated bonding.

FIG. 1 is a diagram illustrating a chip 2 that is wire-bonded to a chip package 4. Generally, in a wire bonding process a thin wire 6 (commonly between 0.7 to 1.0 mil) is used to connect a chip bonding pad 8 to an inner lead 10 on the chip package 4. Each inner lead 10 is coupled to an outer lead (not shown) which, in turn, provides electrical connections to external circuits (not shown). Each wire 6 must be placed individually, which is time consuming, and each wire results in increased electrical resistance in the connection. In addition, the use of wires mandates the observance of minimum spacing requirements to avoid short circuiting wires and performance problems resulting from wires being too close to one another.

FIG. 2 shows a chip package 4 that is electrically coupled with a chip 2 through flip chip/bump bonding. With flip chip/bump bonding, metal bumps 12 placed on each bonding pad 8 on the chip 2 are soldered to the inner leads 14 of the chip package 4. This is usually done by placing the chip 2 in position on the chip package 4 and melting the metal bumps 12 to solder the bonding pads 8 to the inner leads 14. In this way, all of the bonds necessary to electrically connect a chip 2 to a chip package 4 can be done essentially simultaneously, which reduces the time required to interconnect the chip 2 and chip package 4 when compared to wire bonding. Flip-chip bonding, however, requires precise alignment of the chip 2 and the chip package 4 to ensure proper interconnection. Moreover, great care must also be exerted to prevent soldered metal from causing short circuits by propagating from one bonding pad 8 to adjacent bonding pads. Additionally, given the orientation of the chip 2 and the chip package 4, after bonding an efficient visual inspection of the bonds is not possible, and the nature of the bonding procedure mandates that the chip 2 be heated and exposed to pressure.

Tape automated bonding (TAB) is accomplished through the use of a flexible strip of tape on which a metal lead system has been deposited. Initially a conductive layer is deposited on the tape, usually by methods including sputtering and evaporation. This conductive layer is then formed by mechanical stamping or patterning techniques, such as fabrication patterning, resulting in a continuous tape with multiple individual lead systems. In order to bond the tape to the chip, the chip is then placed on a holder and the tape is positioned over the chip with the inner leads of a lead system on the tape being situated exactly over corresponding bonding pads located on the chip. The inner leads and the bonding pads are then pressed together, creating physical and electrical bonds between the inner leads and the bonding pads. TAB requires very precise positioning of the tape and the chip. Even slight misalignment can result in multiple short circuits and missed connections between inner leads and chip pads, thus compromising the electrical connection of the chip to the chip package.

In view of the above-mentioned processes, it is desirable to develop a new process for electrically interconnecting a chip and chip package.

DETAILED DESCRIPTION OF THE INVENTION

Figure 3:
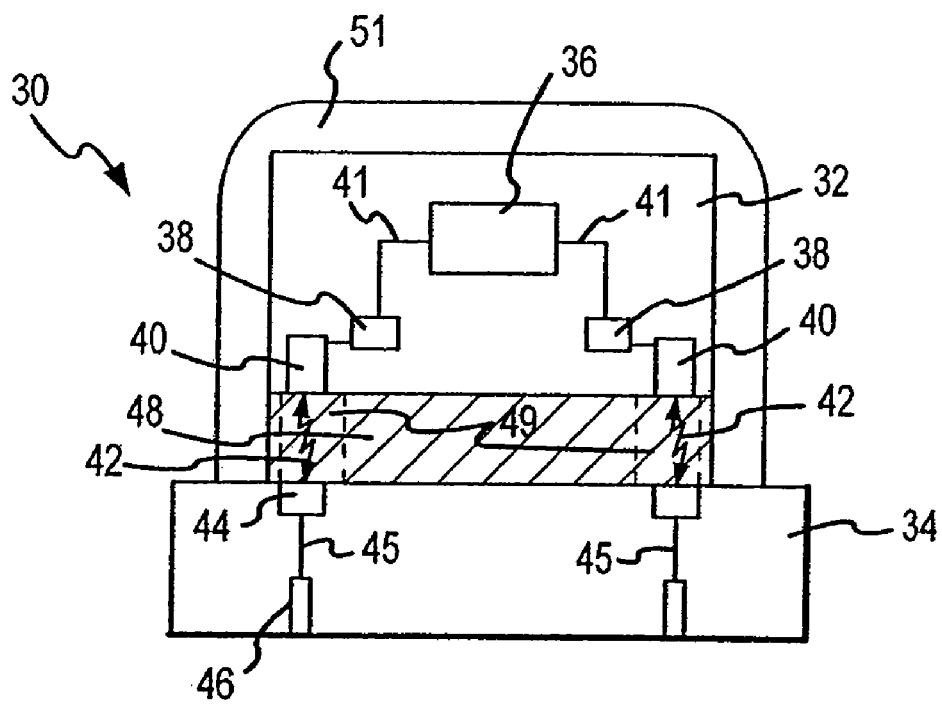
FIG. 3 is a functional and cross-sectional view of a chip that is coupled to a chip package through electromagnetic signals.

FIG. 3 is a functional and cross-sectional view of a microelectronics package 30 including a chip 32 that is coupled to a chip package 34 through electromagnetic signals 42, as will now be explained in more detail. By coupling the chip 32 to the chip package 34 through electromagnetic signals 42, a direct physical connection between the two is eliminated, which can simplify the fabrication of the package 30 and reduce the adverse inductive and capacitive effects associated with conventional bonding techniques. The chip 32 includes electronic circuitry 36 coupled to bonding pads 38 which, in turn, are coupled to first converters 40. It is also possible for the circuitry 36 to be directly coupled to the converters 40 without the use of intervening bonding pads 38. The circuitry 36 in the chip 32 may be a memory device, a processor, or any other type of integrated circuitry.

Each first converter 40 receives a corresponding electric signal 41 from the circuitry 36 via the bonding pad 38, and converts the electric signal into an electromagnetic signal 42. The converter 40 then transmits the electromagnetic signal 42 to a corresponding second converter 44 located on the chip package 34. The second converter 44 receives the electromagnetic signal 42 and converts it to a corresponding electric signal 45 that is applied to an inner lead 46. The first and second converters 40 and 44 may also communicate in the opposite direction, with the second converter 44 converting the electric signal 45 received from the inner lead 46 to the electromagnetic signal 42 which the second converter 40 receives and converts into the electric signal 41 that is applied to the circuitry 36. The first and second converters 40 and 44 may transmit and receive the electromagnetic signals 42 having a wide range of frequencies, including visible light and infrared frequencies. Furthermore, even though FIG. 3 only illustrates a pair of first converters 40 and a pair of second converters 44, more or fewer converters may be employed as desired.

The microelectronics package 30 includes an intermediate layer 48 disposed between the chip 32 and the chip package 34. The intermediate layer 48 has suitable physical characteristics to allow the electromagnetic signals 42 to propagate through the intermediate layer, and may be air, an adhesive layer physically coupling the chip 32 to the chip package 34, or other suitable materials, as will be appreciated by those skilled in the art. The intermediate layer 48 may include regions 49 disposed between the converters 40 and 44, that are formed from different materials than the other portions of the intermediate layer 48. In another embodiment, the intermediate layer 48 is omitted and the chip 32 is physically positioned on the chip package 34 with the converters 40, 44 adjacent one another. An encapsulation layer 51 is typically formed over the chip 32 once the chip is attached to the chip package 34, sealing the chip and chip package to prevent moisture and other contaminants from affecting the operation of the package 30.

Figure 1:
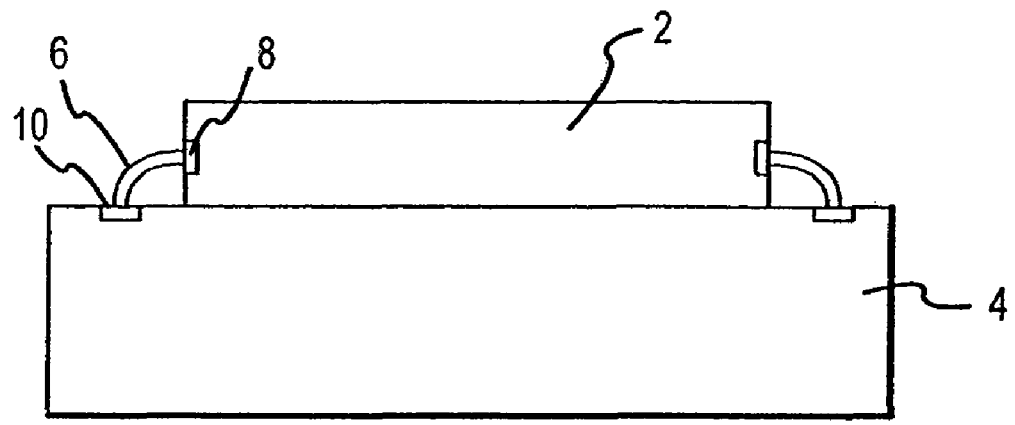
FIG. 1 is a cross-sectional view of a chip wire-bonded to a chip package.
Figure 2:
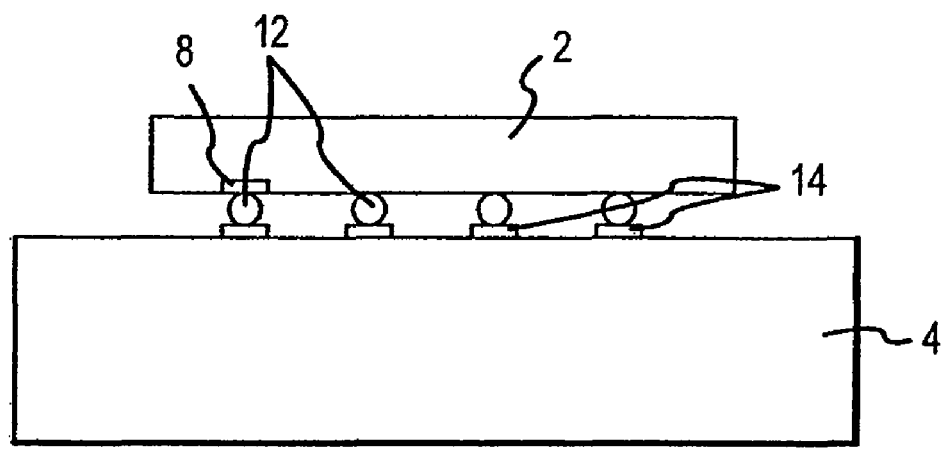
FIG. 2 is a cross-sectional view of a chip bonded by flip chip/bump technology to a chip package.
Figure 4:
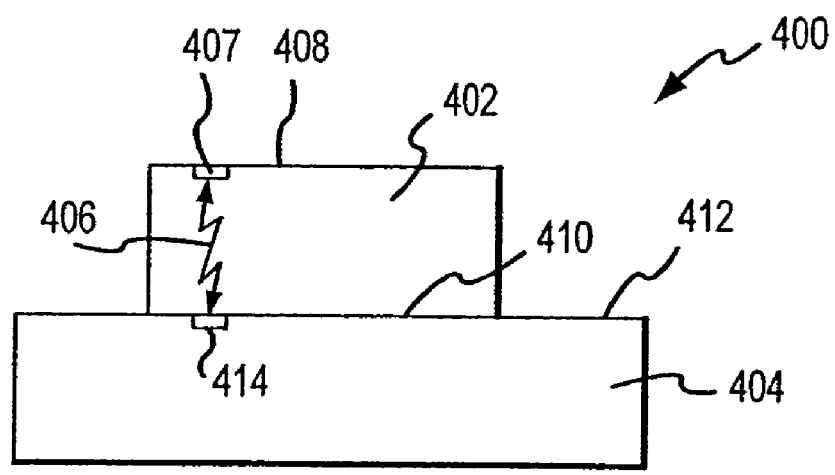
FIG. 4 is a functional and cross-sectional view of a chip and chip package placed into communication according to another embodiment of the invention.

FIG. 4 is a functional and cross-sectional view of a microelectronics package 400 including a silicon chip 402 and a chip package 404 that are electrically coupled through infrared signals 406 according to another embodiment of the invention. Though not shown in FIG. 4, the silicon chip 402 includes circuitry and bonding pads and the chip carrier 404 includes inner leads as previously described for the corresponding components in FIG. 3. A first converter 407 is disposed on a first side 408 of the chip 402, opposite a second side 410 of the adjacent side 412 of the chip package 404. The first converter 407 operates as previously described for the converters 40 of FIG. 3 to convert the infrared signals 406 to electrical signals and visa versa. The second side 410 of the silicon chip 402 may physically contact the side 412 of the chip package 404 or an intermediate layer (not shown) may be disposed between the two.

With the first converter 407 disposed on the first side 408 of the chip 402, the infrared signals 406 propagate though the silicon chip 402 to a second converter 414 disposed on the side 412 of the package 404. Because the chip 402 is silicon, which is substantially transparent to infrared signals, the infrared signals 406 propagate through the chip with a relatively low signal loss. If an intermediate layer is disposed between the silicon chip 402 and the chip package 404, this layer must, of course, have suitable physical characteristics to allow the propagation of infrared signals. In the embodiment of FIG. 4, the chip 402 may be formed from materials other than silicon and the frequency of the signals 406 varied accordingly to allow the signals to propagate through the chip, as will be appreciated by those skilled in the art.

Figure 5:
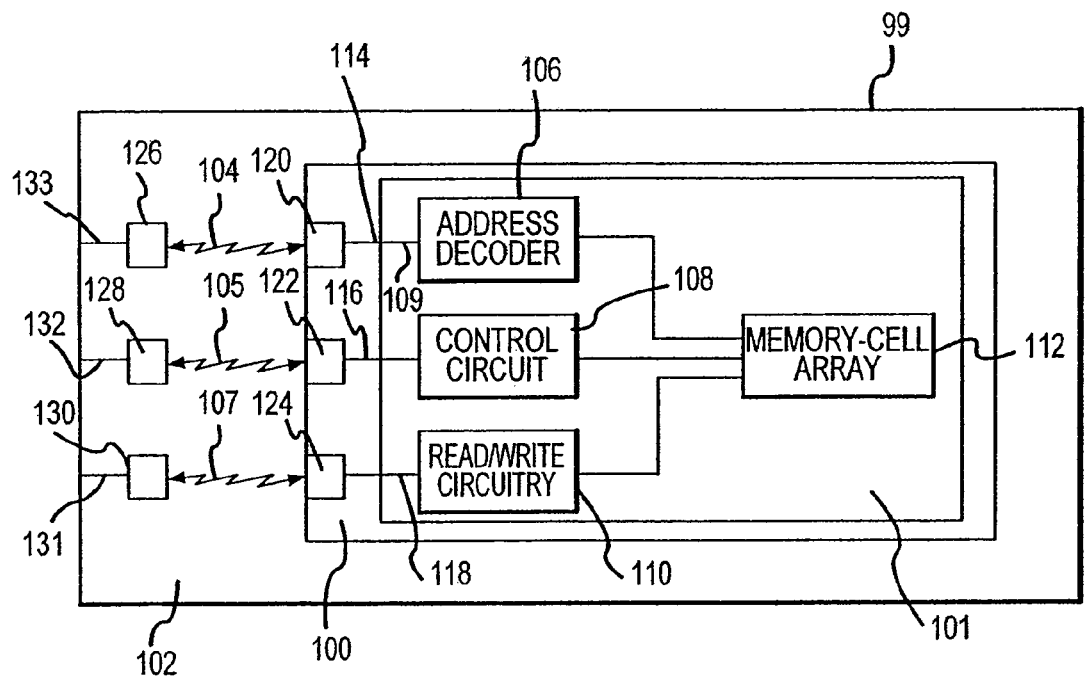
FIG. 5 is a block diagram of a memory device including a semiconductor memory chip coupled to a chip package through electromagnetic signals.

FIG. 5 is a block diagram of a memory device 99 including a semiconductor memory circuit 101 formed on a chip 100 and coupled to a chip package 102 through electromagnetic signals 104, 105, and 107 that include address, control, and data signals, respectively, for transferring data to and from the memory circuitry, as will now be explained in more detail. The memory circuitry 101 includes an address decoder 106, a control circuit 108, and read/write circuitry 110, all of which are conventional and known in the art. The address decoder 106, control circuit 108, and read/write circuitry 110 are all coupled to a memory cell array 112 and are also coupled to an address bus 114, a control bus 116, and a data bus 118, respectively. The memory device 99 may be a synchronous or asynchronous dynamic random access memory or static random access memory, as well as a packetized memory, such as an SLDRAM or RAMBUS device. Moreover, the device 99 need not be a memory device, but may be another type of integrated circuit.

An address converter 120 receives electromagnetic address signals 104 and converts these signals into corresponding electric address signals that are applied to the address decoder 106 over the address bus 114. A control converter 122 receives electromagnetic control signals 105 and converts these signals into corresponding electric control signals that are applied to the control circuit 108 over the control bus 116. A read/write converter 124 operates during write operations of the memory device 99 to receive electromagnetic data signals 107 and convert these signals into corresponding electric data signals that are then applied to the read/write circuitry 110 over the data bus 118. The read/write converter 124 also operates during read data transfers of the memory device 99 to receive electric data signals on the data bus 118 and convert these signals into corresponding electromagnetic data signals 107. A package address decoder 126 is mounted on the chip package 102 adjacent the address decoder 106, and receives electric address signals 133 and converts these signals into the electromagnetic address signals 104, and a package control converter 128 mounted on the chip package adjacent the control converter 122 operates in the same way to generate the electromagnetic control signals 105 in response to electric control signals 132 applied to the chip package. A package read/write converter 130 is mounted on the chip package 102 adjacent the converter 124 and operates during write operations to receive electric data signals 131 and generate the corresponding electromagnetic data signals 107. During read operations, the package read/write converter 130 receives the electromagnetic data signals 107 and generates the corresponding electric data signals 131.

The converters 120-124 on the chip 100 and converters 126-130 on the chip package 102 may communicate via any of a variety of suitable communication protocols, as will be understood by those skilled in the art. Moreover, each converter 120-124 and converter 126-130 may correspond to a number of converters with one converter handling conversion of a single address, control, or data signal. For example, where the data bus 118 is N bits wide, the converter 124 corresponds to N converters and the converter 130 similarly corresponds to N converters. Alternatively, a single converter 120-124 and 126-130 could multiplex and demultiplex a number of data, address, or control signals, as will also be appreciated by those skilled in the art.

In operation, external circuitry (not shown) provides address, control and data signals to the respective leads 131, 132, 133 on the chip package 102. These are transmitted to the respective chip package converters where the electric signals are converted into electromagnetic signals 107,105,104 and transmitted to the respective converters on the chip 100. The converters on the chip may then convert the electromagnetic signals 107,105,104 to electric signals and transmit them over the address bus 114, the control bus 116 and the data bus 118 to the address decoder 106, the control circuit 108 and the read/write circuitry 110 respectively.

In operation during a read cycle of the memory device 99, external circuitry (not shown) provides a read command to the converter 128 in the form of the signals 132, and the converters 128 and 122 operate in combination to apply the read command to the control circuit 108. In response to the read command, the circuit 108 generates a plurality of control signals to control operation of the decoder 106, circuitry 110, and array 112 during the read cycle. The external circuit also provides a memory address to the converter 126 as the signals 133, and the converters 126 and 120 operate in combination to apply the address bus 118 to the address decoder 106. In response to the memory address, the address decoder 106 provides a decoded memory address to the memory-cell array 112 which, in turn, accesses the memory cells corresponding to the address and provides the data in the accessed cells to the read/write circuitry 110. The read/write circuitry 110 then provides this data on the data bus 118 and the converters 124 and 130 operate in combination to output the data as the signals 131 from the chip package 102.

During a write cycle of the memory device 99, external circuitry (not shown) provides a write command to the converter 128 in the form of the signals 132, and the converters 128 and 122 operate in combination to apply the write command to the control circuit 108. In response to the write command, the circuit 108 generates a plurality of control signals to control operation of the decoder 106, circuitry 110, and array 112 during the write cycle. The external circuit also provides data to the converter 130 as the signals 131, and the converters 130 and 124 operate in combination to apply the data to the data bus 118. The read/write circuitry 110 provides the data to the memory-cell array 112 which, in turn, places the data in addressed memory cells.

Figure 6:
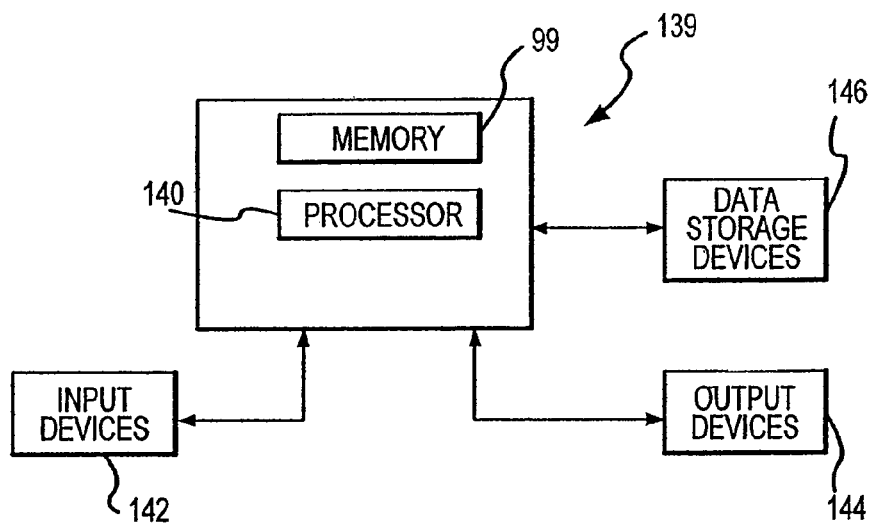
FIG. 6 is a block diagram of a computer system including the memory devices of FIG. 5.

FIG. 6 is a block diagram of a computer system 139 which includes the memory device 99 of FIG. 5. The computer system 139 includes a processor 140 for performing various computing functions, such as executing specific software to perform specific calculations or tasks. In addition, the computer system 139 includes one or more input devices 142, such as a keyboard or mouse, coupled with the processor 140 to allow an operator to interface with the computer system 139. Typically, the computer system 139 also includes one or more output devices 144 coupled to the processor 140, such output devices typically being a printer or video terminal. One or more data storage devices 146 are also typically coupled to the computer processor 140 to store data or retrieve data from external storage media (not shown). Examples of typical storage devices 146 include hard and floppy disks, tape cassettes, and compact disk read only memories (CD-ROMs). The processor 140 is typically coupled to the memory device 99 through a control bus, a data bus, and an address bus to provide for writing to and reading from the memory device.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

The invention claimed is:

1. A microelectronics package, comprising:
a chip having an electronic circuit and a first converter electrically coupled to the circuit to transfer a first electronic signal between the electronic circuit and the first converter, the first converter configured to convert between the electric signal and a corresponding non-electric signal; and
a chip package including a second converter positioned on the chip package and configured to couple the non-electric signal between the first converter and the second converter without the use of any electrical connection between the first converter and the second converter, the second converter being configured to convert between the non-electric signal and a corresponding second electric signal and to couple the second electric signal between the converter and a lead that is electrically isolated from the electronic circuit.

2. The microelectronics package of claim 1 wherein the electronic circuit comprises a memory circuit, and the first electronic signal comprises a data signal.

3. The microelectronics package of claim 1 wherein the first and second converters comprise optical converters, and the non-electric signal comprises an optical signal.

4. The microelectronics package of claim 1 wherein the first and second converters comprise infrared converters, and the non-electric signal comprises an infrared signal.

5. The microelectronics package of claim 1 wherein the first and second converters comprise a plurality of first and second converter pairs, each pair operating in combination to communicate a respective non-electrical signal between the first converter and the second converter.

6. The microelectronics package of claim 1 wherein the first converter is configured to receive the first electronic signal from the electronic circuit, to convert the first electronic signal to a corresponding non-electric signal, and to transmit the non-electric signal to the second converter, and wherein the second converter is configured to receive the non-electric signal from the first converter, and to convert the non-electric signal to the second electronic signal corresponding to the non-electric signal.

7. The microelectronics package of claim 1 wherein the second converter is configured to receive the second electronic signal, to convert the second electronic signal to a corresponding non-electric signal, and to transmit the non-electric signal to the first converter, and wherein the first converter is configured to receive the non-electric signal from the second converter, to convert the non-electric signal to the first electronic signal corresponding to the non-electric signal and to couple the first electronic signal to the electronic circuit.

8. The microelectronics package of claim 7 wherein the first converter is further configured to receive a third electronic signal from the electronic circuit, to convert the third electronic signal to a corresponding non-electric signal, and to transmit the non-electric signal corresponding to the third electronic signal to the second converter, and wherein the second converter is further configured to receive the non-electric signal corresponding to the third electronic signal from the first converter, and to convert the non-electric signal corresponding to the third electronic signal to a fourth electronic signal.

9. The microelectronics package of claim 7 wherein the electronic circuit comprises a memory circuit, and the second electronic signal comprises at least one of a memory command signal, a memory address signal, and a write data signal.

10. The microelectronics package of claim 1 wherein at least one of the first and second converters comprise a laser diode.

11. The microelectronics package of claim 1 wherein the first and second converters are mounted on opposite surfaces of a intermediate substrate having physical characteristics allowing the non-electric signal to propagate through the intermediate substrate between the first and second converters.

12. A semiconductor chip, comprising:
an electronic circuit formed in the chip; and
a converter coupled to the circuit, the converter configured to either convert an electrical signal received from the electronic circuit to a corresponding non-electric signal and transmit the non-electric signal from the converter, or to receive a non-electric signal, convert the non-electric signal to a corresponding electrical signal, and to apply the electrical signal to the electronic circuit.

13. The semiconductor chip of claim 12 wherein the converter comprises an optical converter, and the non-electric signal comprises an optical signal.

14. The semiconductor chip of claim 12 wherein the converter comprises an infra-red converter, and the non-electric signal comprises an infra-red signal.

15. The semiconductor chip of claim 12 wherein the converter comprises a laser diode.

16. A memory device, comprising:
a chip including memory circuitry, the memory circuitry including, an address decoder coupled to an address bus; a read/write circuit coupled to a data bus; a control circuit coupled to a control bus; a memory-cell array coupled to the address decoder, control circuit, and read/write circuit; and
a converter coupled to the address, data, and control busses, the converter operable to receive electrical read data signals from the memory circuitry through the data bus and convert the electrical read data signals into corresponding non-electrical read data signals, and operable to receive non-electrical command, address, and write data signals, convert the non-electrical command, address, and write data signals to corresponding electrical command, address, and write data signals, and to apply the electrical command, address, and write data signals to the memory circuitry through control bus, address bus, and data bus, respectively.

17. The memory device of claim 16 wherein the converter comprises an optical converter, and the non-electric command, address, and data signals comprise optical command, address, and data signals.

18. The memory device of claim 16 wherein the converter comprises an infra-red converter, and the non-electric command, address, and data signals comprise infra-red command, address, and data signals.

19. The memory device of claim 16 wherein the memory device comprises a dynamic random access memory device.

20. The memory device of claim 16 wherein the converter comprises a laser diode.

* * * * *